United States Patent
Lee et al.

(10) Patent No.: US 8,609,546 B2
(45) Date of Patent: Dec. 17, 2013

(54) PULSED BIAS PLASMA PROCESS TO CONTROL MICROLOADING

(75) Inventors: Wonchul Lee, San Ramon, CA (US); Qian Fu, Pleasanton, CA (US); Shenjian Liu, San Ramon, CA (US); Bryan Pu, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 405 days.

(21) Appl. No.: 12/744,588

(22) PCT Filed: Nov. 18, 2008

(86) PCT No.: PCT/US2008/083942
§ 371 (c)(1),
(2), (4) Date: Feb. 9, 2011

(87) PCT Pub. No.: WO2009/073361
PCT Pub. Date: Jun. 11, 2009

(65) Prior Publication Data
US 2011/0281438 A1    Nov. 17, 2011

Related U.S. Application Data

(60) Provisional application No. 60/991,124, filed on Nov. 29, 2007.

(51) Int. Cl.
*H01L 21/302* (2006.01)
*H01L 21/461* (2006.01)

(52) U.S. Cl.
USPC ........... 438/706; 438/707; 438/708; 438/709; 438/710; 438/711; 438/712; 438/713; 438/714; 438/720

(58) Field of Classification Search
None
See application file for complete search history.

(56) References Cited

U.S. PATENT DOCUMENTS

| | | | |
|---|---|---|---|
| 4,985,114 A | 1/1991 | Okudaira et al. | |
| 5,501,893 A | 3/1996 | Laermer et al. | |
| 5,705,433 A * | 1/1998 | Olson et al. | 438/695 |
| 6,051,503 A | 4/2000 | Bhardwaj et al. | |
| 6,251,791 B1 | 6/2001 | Tsai et al. | |
| 6,332,425 B1 | 12/2001 | Kofuji et al. | |
| 7,547,636 B2 * | 6/2009 | Chi et al. | 438/714 |
| 2002/0069971 A1 | 6/2002 | Kaji et al. | |
| 2003/0183599 A1 | 10/2003 | Kikuchi et al. | |
| 2004/0058541 A1 * | 3/2004 | Ono et al. | 438/689 |
| 2006/0154151 A1 | 7/2006 | Anderson et al. | |

FOREIGN PATENT DOCUMENTS

KR    10-2002-0044001    6/2002

OTHER PUBLICATIONS

U.S. Appl. No. 12/744,012, filed May 20, 2010.

* cited by examiner

*Primary Examiner* — Duy Deo
(74) *Attorney, Agent, or Firm* — Beyer Law Group LLP

(57) ABSTRACT

A method for etching a conductive layer through a mask with wider and narrower features is provided. A steady state etch gas is flowed. A steady state RF power is provided to form a plasma from the etch gas. A pulsed bias voltage is provided during the steady state etch gas flow, wherein the pulsed bias voltage has a frequency between 1 to 10,000 Hz. Wider and narrower features are etched into the conductive layer using the plasma formed from the etch gas.

21 Claims, 4 Drawing Sheets

PULSED BIAS PLASMA PROCESS TO CONTROL MICROLOADING

BACKGROUND OF THE INVENTION

The present invention relates to etching a layer having features of different aspect ratios. More specifically, the present invention relates to reducing microloading during the etching of an etch layer having both open and dense features.

During semiconductor wafer processing, sometimes a semiconductor device may have both open and dense features. The open features have wider widths, while the dense features have narrower widths. As a result, the semiconductor device may have features of different aspect ratios. The aspect ratio of a feature is the ratio between the height and the width of the feature. Thus, if the heights of all the features of a semiconductor device are approximately the same, then the open features have relatively low aspect ratios, while the dense features have relatively high aspect ratios.

During the etching of such semiconductor devices having features of different aspect ratios, and especially when the aspect ratios of the features are high, microloading is becoming a common problem. As a result, the open features etch faster than the dense features. Often, when the etching of the open features is completed, the etching of the dense features may only have been completed partially. This is known as "aspect ratio dependent etching." Continuing the etch process in order to complete the etching of the dense features may cause the open features to be etched into the layer(s) beneath the layer being etched, such as the substrate, and damage the semiconductor devices.

SUMMARY OF THE INVENTION

To achieve the foregoing and in accordance with the purpose of the present invention, in one embodiment, a method of etching a conductive layer through a mask with wider and narrower features is provided. A steady state etch gas is flowed. A steady state RF power is provided to form a plasma from the etch gas. A pulsed bias voltage is provided during the steady state etch gas flow, wherein the pulsed bias voltage has a frequency between 1 to 10,000 Hz. Wider and narrower features are etched into the conductive layer using the plasma formed from the etch gas.

In another manifestation of the invention, a computer implemented method of etching an etch layer through a mask with wider and narrower features is provided. A steady state etch gas, comprising a deposition component and an etch component, is flowed into the plasma chamber. A steady state RF power is provided to form a plasma from the etch gas in the plasma chamber. A pulsed bias voltage is provided during the steady state etch gas flow to the plasma chamber, wherein the pulsed bias voltage has a frequency between 1 to 10,000 Hz. The etch layer is etched using the plasma formed from the etch gas to form wider and narrower etch features with reduced microloading.

In another manifestation of the invention, an apparatus for etching an etch layer through a mask with wider and narrower features is provided. A plasma reactor is provided, comprising a plasma processing chamber, an RF-transparent window, a transformer coupled power (TCP) coil adjacent to the RF-transparent window for providing power for sustaining a plasma, a TCP power supply electrically connected to the TCP coil, a chuck electrode for supporting a semiconductor substrate within the plasma processing chamber, a bias power supply electrically connected to the chuck electrode, a bias power controller for controlling the bias power supply, wherein the bias power controller is able to cause the bias power supply to provide a pulsed bias power between 1 to 10,000 Hz, a pressure control valve and a pump for regulating the pressure in the plasma processing chamber, a gas source, comprising a etch gas component source and a deposition gas component source, and a controller controllably connected to the gas source and the TCP coil. The controller comprises at least one processor and computer readable media. The computer readable media comprises computer readable code for flowing a steady state etch gas, comprising a deposition component and an etch component into the plasma processing chamber, computer readable code for providing a steady state RF power to form a plasma from the etch gas in the plasma processing chamber, computer readable code for providing a pulsed bias voltage during the steady state etch gas flow to the plasma processing chamber, wherein the pulsed bias voltage has a frequency between 1 to 10,000 Hz, and computer readable code for etching the etch layer using the plasma formed from the etch gas to form wider and narrower etch features with reduced microloading.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

During the etching of semiconductor devices having features of different widths or different aspect ratios, and especially when the aspect ratios of the features are high, etch rate microloading is becoming a common problem. Microloading causes open features, i.e., features with wider widths, to etch faster than dense features, i.e., features with narrow widths.

Figure 1:
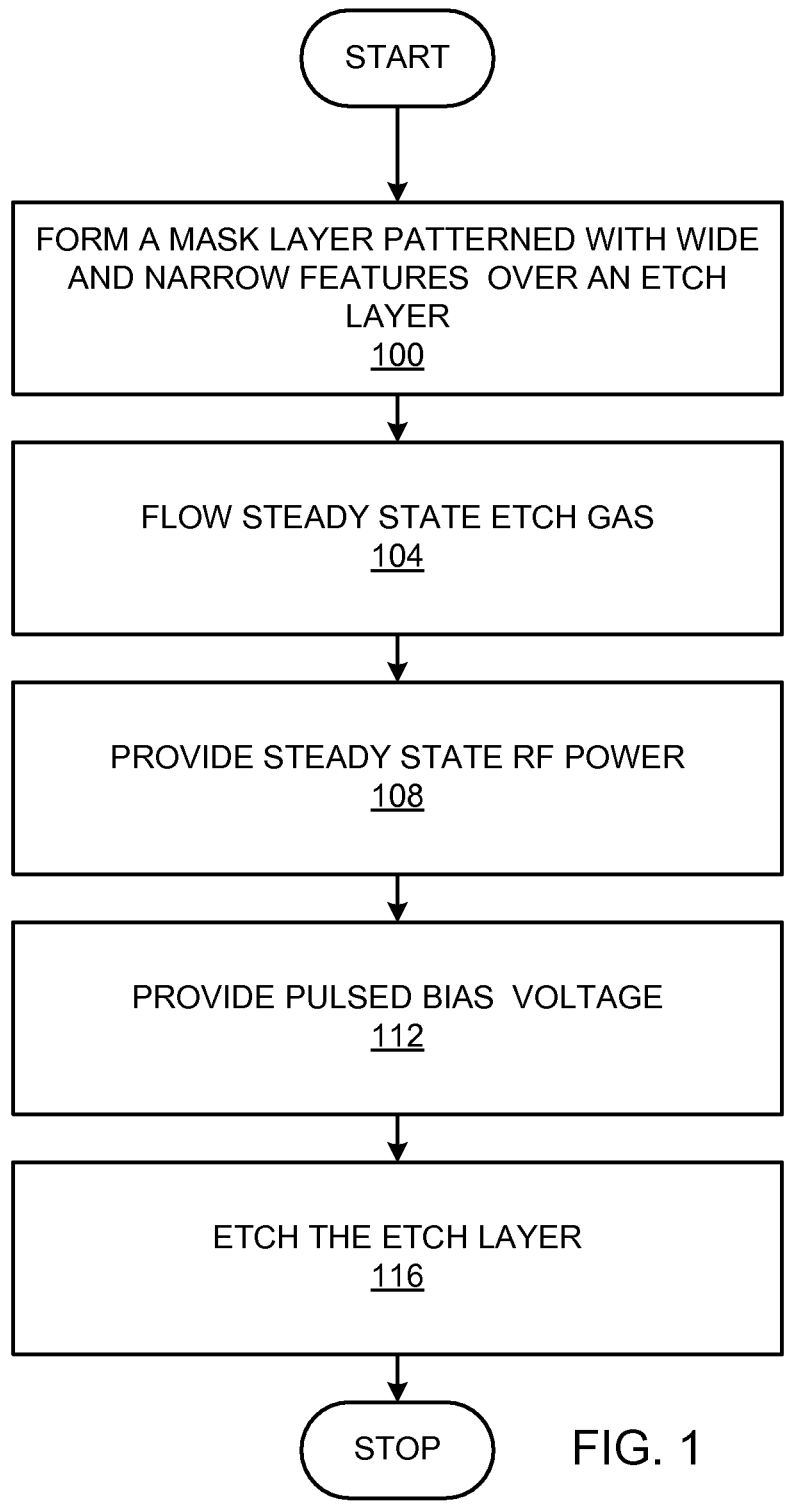
FIG. 1 is a high level flow chart of an embodiment of the invention.

To facilitate understanding, FIG. 1 is a high level flow chart of a process used in an embodiment of the invention. A mask layer patterned with features of different aspect ratios (i.e., open and dense features) is formed over an etch layer (step 100). The open and dense features will eventually be etched into the etch layer.

A steady state etch gas is flowed into the etch chamber (step 104). Such a steady state etch gas does not use gas modulation, but instead provides a continuous flow of the same gas chemistry during the process. A steady state RF power is provided (step 108). Such a steady state RF power is not pulsed. In the specification and claims, steady state is defined as not varying or pulsed, but instead constant. The steady state RF power transforms the etch gas into an etch plasma. A pulsed bias voltage is provided (step 112). The pulsed bias voltage has a pulse frequency between 1 Hz to 10,000 Hz. More preferably, the pulse frequency is between 10 Hz to 5,000 Hz. The etch plasma is used to etch the etch layer (step 116). The etch rate between the wide and narrow features is balanced and etch rate microloading is eliminated.

Figure 2:
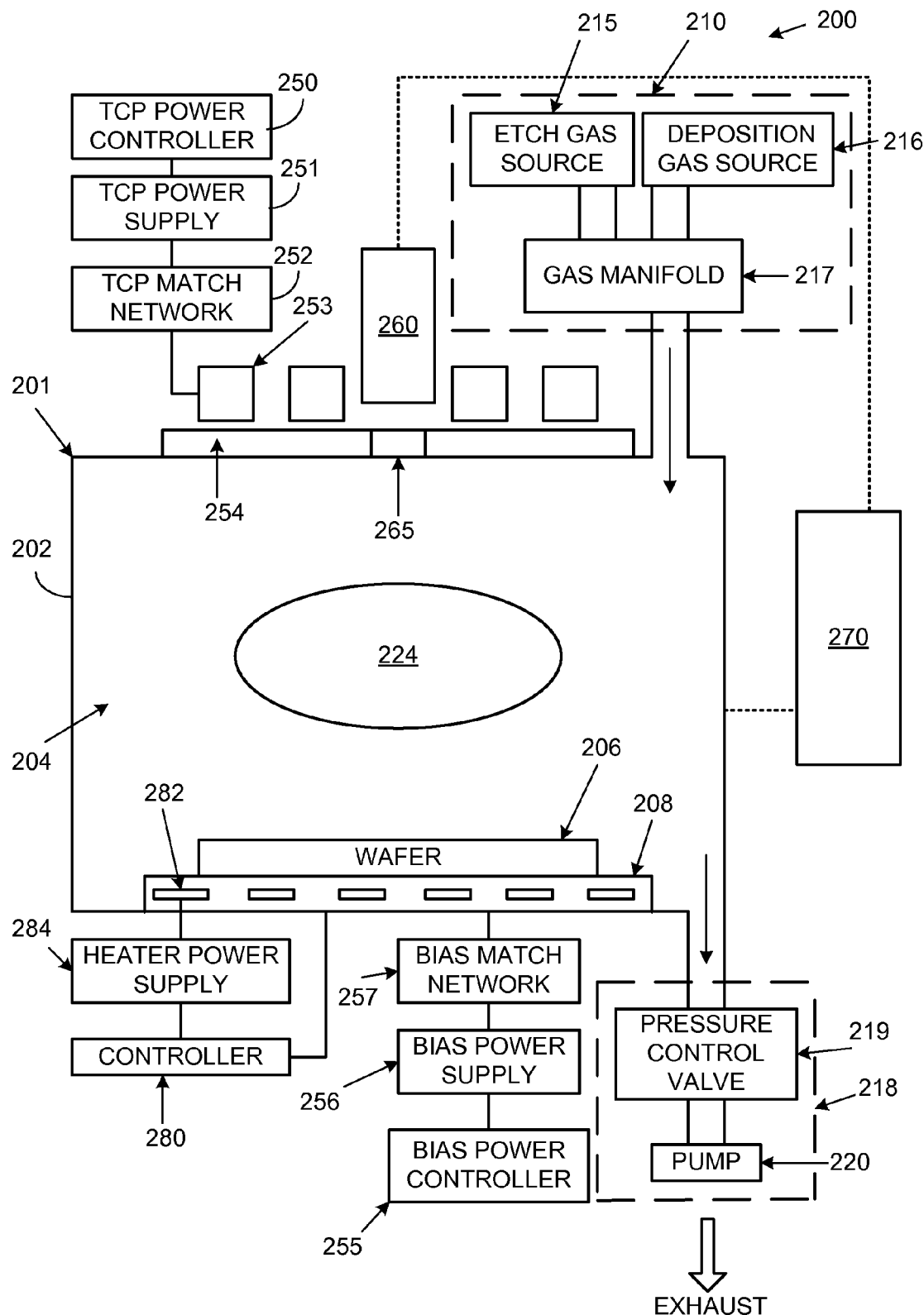
FIG. 2 is a schematic view of a plasma processing chamber that may be used for etching.

In a specific example of the invention, the etch layer is a tungsten containing layer. Most preferably, the target layer is a tungsten layer. More broadly, the etch layer may be a conductive or a dielectric layer. Preferably, the etch layer is an electrically conductive layer. More preferably, the etch layer is a conductive metal containing layer. To etch a tungsten containing layer, the tungsten containing layer and the related stack may be placed in a plasma processing chamber. FIG. 2 is a schematic view of a plasma processing system 200, including a plasma processing tool 201. The plasma processing tool 201 is an inductively coupled plasma etching tool and includes a plasma reactor 202 having a plasma processing chamber 204 therein. A transformer coupled power (TCP) controller 250 and a bias power controller 255, respectively, control a TCP power supply 251 and a bias power supply 256 influencing the plasma 224 created within plasma chamber 204.

The TCP power controller 250 sets a set point for TCP power supply 251 configured to supply a radio frequency signal at 13.56 MHz, tuned by a TCP match network 252, to a TCP coil 253 located near the plasma chamber 204. An RF transparent window 254 is provided to separate TCP coil 253 from plasma chamber 204 while allowing energy to pass from TCP coil 253 to plasma chamber 204. An optically transparent window 265 is provided by a circular piece of sapphire having a diameter of approximately 2.5 cm (1 inch) located in an aperture in the RF transparent window 254.

The bias power controller 255 sets a set point for bias power supply 256 configured to supply an RF signal, tuned by bias match network 257, to a chuck electrode 208 located within the plasma chamber 204 creating a direct current (DC) bias above electrode 208 which is adapted to receive a substrate 206, such as a semiconductor wafer work piece, being processed. The bias power controller 255 is also able to pulse the bias power, preferably with a pulse frequency between 1 Hz to 10,000 Hz.

A gas supply mechanism or gas source 210 includes sources of gases attached via a gas manifold 217 to supply the proper chemistry required for the processes to the interior of the plasma chamber 204. One source of gas may be the etch gas source 215 that supplies the proper chemistry for etching the tungsten containing layer. Another source of gas may be the deposition gas source 216 that supplies the proper chemistry for depositing onto the tungsten containing layer. A gas exhaust mechanism 218 includes a pressure control valve 219 and exhaust pump 220, and removes particles from within the plasma chamber 204 and maintains a particular pressure within plasma chamber 204.

A temperature controller 280 controls the temperature of heaters 282 provided within the chuck electrode 208 by controlling a heater power supply 284. The plasma processing system 200 also includes electronic control circuitry 270. The control circuitry 270 may control the temperature controller 280, the gas source 210, the bias power controller 255, and the TCP power controller 250. One or more of these controllers may be integrated into the control circuitry. The plasma processing system 200 may also have an end point detector 260.

Figure 3A:
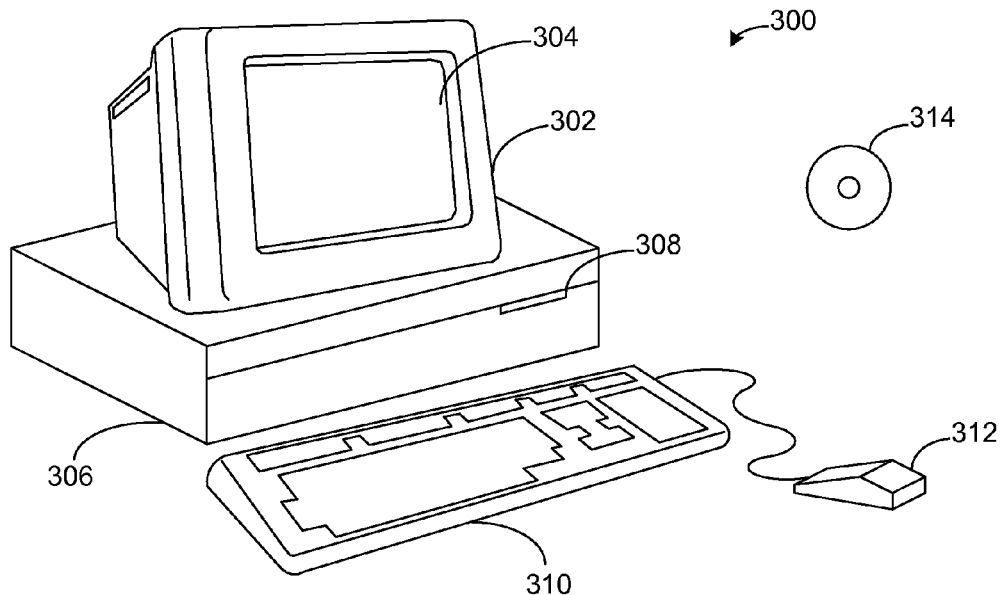
FIGS. 3A-B illustrate a computer system, which is suitable for implementing a controller used in embodiments of the present invention.
Figure 3B:
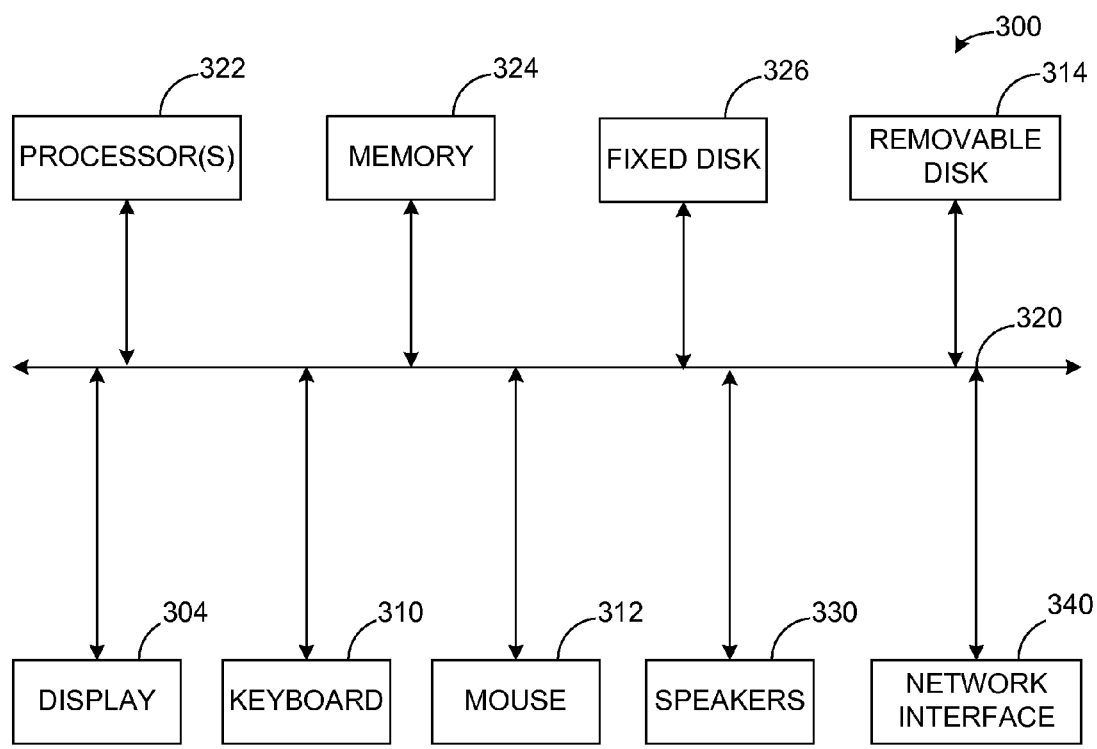

FIGS. 3A and 3B illustrate a computer system, which is suitable for implementing the control circuitry 270 used in one or more embodiments of the present invention. FIG. 3A shows one possible physical form of the computer system 300. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 is a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of any of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

Figure 4A:
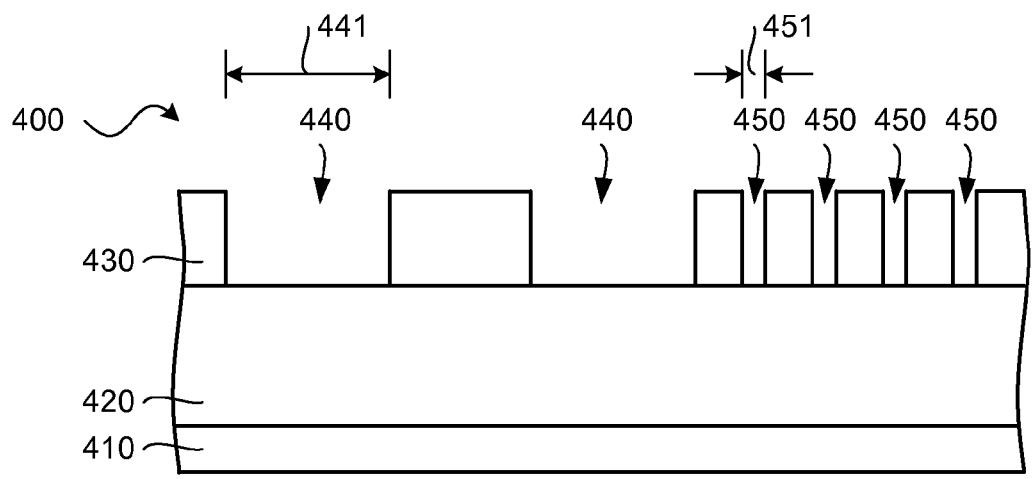
FIGS. 4A-C are schematic views of a stack processed according to an embodiment of the invention.
Figure 4B:
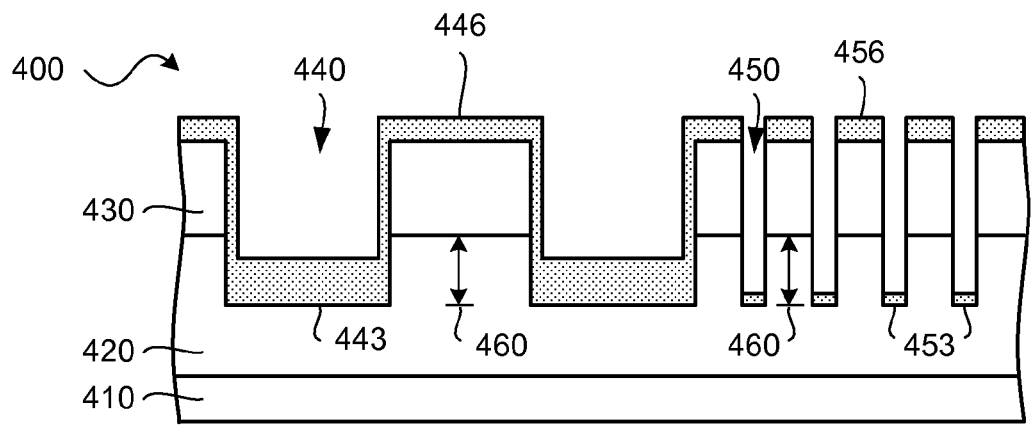
Figure 4C:
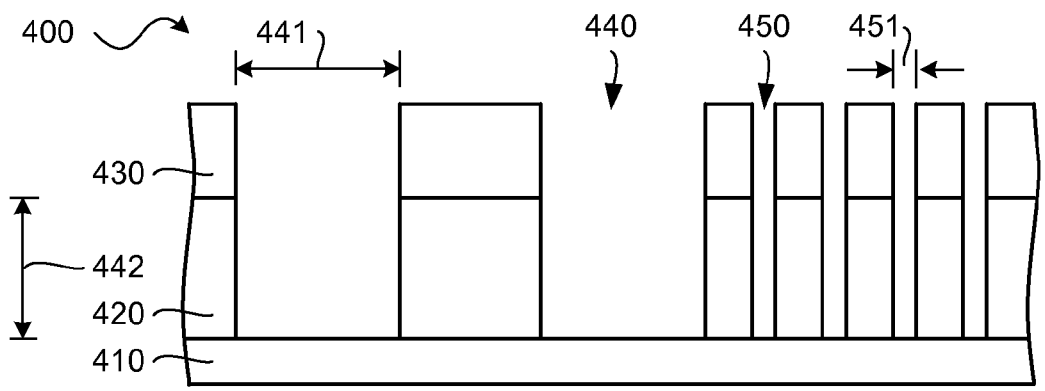

To facilitate understanding of the invention, FIGS. 4A-C are schematic views of a stack processed according to an embodiment of the invention.

A mask layer patterned with features of different aspect ratios (i.e., open and dense features) is formed over an etch layer (step 100). FIG. 4A is a schematic cross-sectional illustration of a stack 400 with a substrate 410, over which an etch layer 420 is provided. Although the etch layer 420 is shown on the substrate 410, one or more layers may be disposed between them, as long as the etch layer 420 is over the substrate 410. The etch layer 420 is preferably a conductive layer, although it may be a dielectric layer. A mask layer 430 is present over the etch layer 420. The mask layer 430 may be a carbon-based mask, such as CH or CF or amorphous carbon, or an inorganic hard mask, such as silicon dioxide, silicon nitride, or the like. The mask layer 430 is patterned with both open features 440 and dense features 450.

The widths 441 of the open features 440 are relatively greater than the widths 451 of the dense features 450. In other words, the open features 440 have wider openings than the dense features 450. Thus, the open features 440 may also be referred to as the "wider" features, and the dense features 450 may also be referred to as the "narrower" features. Preferably, the open or wider features 440 are at least 2 times wider than the dense or narrower features 450. More preferably, the open or wider features 440 are at least 5 times wider than the dense or narrower features 450. Most preferably, the open or wider features 440 are at least 10 times wider than the dense or narrower features 450.

A steady state etch gas is flowed into the chamber (step 104). In this example the etch gas comprises a deposition component and an etch component. The deposition component comprises a silicon-containing component and an oxygen containing component. The silicon-containing component of the etch gas may be any gaseous chemical containing silicon. For example, the silicon-containing component may be an organic siloxane; that is, a chemical compound of silicon, oxygen, and carbon based on the structural unit $R_2SiO$ where R is an alkyl group such as methyl, ethyl, propyl, or the like, and which has a boiling point at or below 150 degrees Celsius. Examples of suitable siloxane compounds include but are not limited to tetramethyldisiloxane [$((CH_3)_2SiH)_2O$], pentamethyldisiloxane, and hexamethyldisiloxane. The silicon-containing compound may also be a chemical compound similar to siloxane but where the bridging oxygen is replaced with a nitrogen (as in the examples of tetramethyldisilazane, hexamethyldisilazane, or N-methyl-N-silyl-Silanamine), or compounds of silicon, carbon, and hydrogen such as disilylacetylene [$C_2H_6Si_2$].

Alternatively, the silicon-containing component may be an organosilicon compound based on the structural unit $SiA_xZ_{(4-x)}$ where A is selected from the group H, F, Cl, Br, or I, where Z is an alkyl group such as methyl, ethyl, propyl, or the like, where x may vary from zero to four, and which has a boiling point at or below 150 degrees Celsius. For example, the silicon-containing component may be dimethylsilane [$(CH_3)_2SiH_2$] where x equals two, A is hydrogen, and Z is a methyl group. In another example, the silicon-containing component may be dichlorodimethyl silane [$(CH_3)_2SiCl_2$] where x equals two, A is chlorine, and Z is a methyl group. In yet another example, the silicon-containing component may be tetramethylsilane [$(CH_3)_4Si$] where x equals zero and Z is a methyl group.

Preferably, the silicon containing component is silane-based; that is, a silane, or a halogenated silane. A silane is comprised of $SiH_4$ or higher silanes with the empirical formula $Si_xH_{(2x+2)}$ where x has a minimum value of one. A halogenated silane is comprised of a compound with the empirical formula $Si_xA_yH_{(2x+2-y)}$, where A is selected from the group F, Cl, Br, or I, and x and y may each have a minimum value of one. More preferably, the silane-based silicon containing component is a halogenated silane. Most preferably, the silane-based silicon containing component is silicon tetrachloride ($SiCl_4$).

The oxygen containing component of the deposition component, in some cases, may be provided via the silicon containing component process gas. For example, if the silicon containing component comprises a siloxane, the oxygen containing component of the deposition component may be the oxygen from the siloxane. In other cases, the oxygen containing component of the deposition component may be supplied separately from the silicon containing component. That is, the oxygen containing component may contain elemental oxygen but not silicon. For example, the oxygen containing component may be CO, $CO_2$, $O_3$, $H_2O$, or $O_2$. Alternatively, the oxygen for the oxygen containing component of the deposition component may be from both a silicon containing process gas, such as a siloxane, and a separate oxygen containing component, which does not contain silicon. Preferably, the oxygen containing component of the deposition component is from a separate oxygen containing component, which contains elemental oxygen but not silicon. Most preferably, the oxygen containing component is $O_2$.

A steady state RF is provided (step 108). The steady state RF in this example is not pulsed. In one example the steady state RF is 900 Watts TCP power at a frequency of 13.56 MHz. A pulsed bias voltage is provided (step 112). Preferably, the pulsing of the bias voltage has a frequency of between 1 Hz to 10,000 Hz. More preferably, the pulsed bias has a frequency between 5 Hz to 8,000 Hz. Most preferably, the pulsed bias is between 10 Hz to 5000 Hz. The conductive or dielectric layer is etched (step 116). The duty cycle may also be used to further tune the pulsed bias to reduce or eliminate microloading. Preferably, the duty cycle is between 10% and 90%.

It has been unexpectedly found that the use of a pulsed bias reduces or eliminates microloading. Without being bound by theory, it is believed that the pulsed bias provides series of net etches and net depositions if a recipe contains both etch component and deposition component. When the bias voltage is high, an etch process occurs by etch component, while deposition process occurs by deposition component when the bias voltage is low. In other words, etch process and deposition process occurs consecutively and periodically while the pulsed bias is supplied. The ratio between etch and deposition is controlled by duty cycle of pulsed bias as well as the recipe.

It is believed that the etching of the etch layer 420 is aspect ratio dependent. The open (wider, low aspect ratio) features 440 are etched faster than the dense (narrower, high aspect ratio) features 450. However, it is also believed that the deposition on the etch layer of the deposition component is selective to the open features. Deposition 443 inside, and especially on the bottom of the open (wider, low aspect ratio) features 440 is more than deposition 453 inside the dense (narrower, high aspect ratio) features 450 because deposition chemicals go inside the open features 440 faster than the dense features 450. Thus, the deposition is also aspect ratio dependent.

Introduction of deposition process by the pulsed bias slows down overall etch rate. However, it slows down the etch rate more at wide features than at narrow features since the deposition process is aspect ratio dependent. More deposition at wide features slows down the etch rate more at wide features, which, in turn, results in microloading reduction. When an appropriate recipe with both etch component and deposition component is used, the microloading can be controlled from positive to negative by duty cycle variation of the pulsed bias. If etch process and deposition process are well balanced, the etch rate at narrow features becomes the same as that at wide features.

In addition, it is believed that the pulsed bias reduces charge build up on the mask surface during etching. Since electrons have higher mobility than positive ions in the plasma, they can easily overcome plasma sheath and collide with the surface of the mask layer, resulting in build up charges in the mask layer. This charge build up of the mask layer would provide electric field which would trap and consume etching ions and thus reduce the etch rate. This reduction in the etch rate is more significant in dense areas with higher aspect ratios than with open areas with lower aspect ratios. By having the pulsed bias reduce the charge build up, the pulsed bias provides another way of reducing microloading.

By providing a steady state gas, instead of an alternating gas, and a steady state RF, this embodiment does not have any turbulence issue, allowing pulsing of the bias up to 10,000 Hz. A higher pulse frequency allows for smoother sidewall profiles.

A specific etch recipe provides a pressure of 4 milliTorr. An RF power source provides 900 Watts of TCP power with a frequency of 13.56 MHz. A bias power source provides 90 Watts of bias power at 2 MHz. An etch gas of 30 sccm $Cl_2$, 25 sccm $NF_3$, 30 sccm $O_2$, 70 sccm $N_2$, and 10 sccm $SiCl_4$ is flowed into the chamber. A temperature of 60-55° C. is maintained in the chamber. The bias power is pulsed at 10 Hz with a 50% duty cycle, which resulted in −11% microloading. It has been found that the above recipe with a 70% duty cycle made +6% microloading.

FIG. 4B shows a schematic cross-sectional illustration of the stack 400 during the etch process (step 116). Although a deposition layer is illustrated, such illustration is only to facilitate understanding. During the actual etch the balancing of the etch and deposition process may result in no visible deposition layer being formed. The etching of the etch layer 420 is aspect ratio dependent. The open (wider, low aspect ratio) features 440 are etched faster than the dense (narrower, high aspect ratio) features 450. Deposition 443 inside, and especially on the bottom of the open (wider, low aspect ratio) features 440 is more than deposition 453 inside the dense (narrower, high aspect ratio) features 450 because deposition chemicals go inside the open features 440 faster than the dense features 450, i.e., the deposition is also aspect ratio dependent.

The ratio between etch and deposition is controlled by duty cycle of pulsed bias as well as the recipe. When the etch process and deposition process are reasonably balanced, the etch layer 420 is etched without noticeable deposition. The deposition process just slows down the etch rate selectively to the open area and reduces microloading.

The greater deposition on the bottom of the open features 440 compensates for the faster etching of the open features 440, resulting in approximately the same depth 460 of the etch layer 420 etched away for both open 440 and narrow 450 features during the etch step. That is, the lower etch rate in the open features 440 resulting from the selective deposition in those features 443 results in zero microloading. Reverse or positive microloading can also be achieved by modifying the duty cycle of the pulsed bias.

Furthermore, the deposition is non-conformal, such that there is much more deposition on the bottom of the features than over the sidewalls of the features. Having little or no deposition over the sidewalls of the features may prevent narrowing the opening of the features.

There may also be some amount of deposition 446, 456 on top of the mask layer 430. Etching of the mask layer 430 also occurs in the etch step 116. Deposition 446 and 456 on top of the mask layer 430 reduces the etch rate of the mask layer 430.

The etch component and the deposition component are provided in a single step (step 104) as the etch layer 420 is etched, until the etch layer 420 is completely etched. In this example, the deposition may be silicon-oxide (SiO) based, such as using $SiCl_4$ and $O_2$ deposition components.

FIG. 4C shows a schematic cross-sectional illustration of the stack 400 after the etch layer 420 has been completely etched. The features 440 and 450 have reached the bottom of the etch layer 420 in both the wide features 441 and the narrow features 451. That is, there is no etch layer 420 remaining in the narrow features 450 when the etch layer 420 has been completely removed from the bottom of the wide features 440. The non-conformal deposition has prevented narrowing of the openings in the wide features 441 and the narrow features 451, and deposition deposited on top of the features during the etch has reduced the erosion of the mask 430.

After etching is complete, the widths 441 of the open (wider) features 440 are relatively greater than the widths 451 of the dense (narrower) features 450. The heights 442 of both the open (wider) features 440 and the dense (narrower) features 450 are approximately the same. Thus, the aspect ratios of the open (wider) features 440 are relatively lower or smaller than the aspect ratios of the dense (narrower) features 450. In this example, the aspect ratios of the features in the etch layer 420 may be greater than 1:1. In another example, the aspect ratios of the features in the etch layer 420 may be greater than 7:1. In a third example, the aspect ratios of the features in the etch layer 420 may be greater than 15:1. In this example, the widths of the dense (narrower) features are approximately 80 nanometers (nm) or less. The heights of the features are approximately 150 nm or more.

In another embodiment of the invention an AC or RF power source may be used to induce and provide a bias voltage. Such AC or RF power source would be modulated to provide a pulsed bias voltage.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of etching a conductive layer through a mask with wider and narrower features, comprising:
    (a) flowing a steady state etch gas;
    (b) providing a steady state RF power to form a plasma from the etch gas;

(c) providing a pulsed bias voltage during the steady state etch gas flow, wherein the pulsed bias voltage has a frequency between 1 to 10,000 Hz; and (d) etching wider and narrower features at substantially the same etch rate into the conductive layer using the plasma formed from the etch gas.

2. The method, as recited in claim 1, wherein the pulsed bias voltage reduces microloading between the wider and narrower features.

3. The method, as recited in claim 1, wherein the etch gas comprises a deposition component and an etch component.

4. The method, as recited in claim 3, wherein when the bias voltage is low, a net deposition results, and when the bias voltage is high, a net etch results.

5. The method, as recited in claim 4, wherein the net deposition is directional and the net etch is directional.

6. The method, as recited in claim 1, wherein the conductive layer is a tungsten containing layer.

7. The method, as recited in claim 1, wherein the pulsed bias has a frequency between 10 Hz and 5,000 Hz.

8. The method, as recited in claim 3, wherein the deposition component of the etch gas comprises:
   a silicon containing component; and
   an oxygen containing component.

9. The method, as recited in claim 8, wherein the silicon containing component is a halogenated silane.

10. The method, as recited in claim 9, wherein the oxygen-containing component is oxygen ($O_2$).

11. The method, as recited in claim 8, wherein the oxygen-containing component is oxygen ($O_2$).

12. The method, as recited in claim 1, wherein the pulsed bias voltage is a pulsed DC voltage.

13. A method of etching a conductive layer through a mask with wider and narrower features, comprising:
   (a) flowing a steady state etch gas comprising:
      a silicon containing component; and
      an oxygen containing component;
   (b) providing a steady state RF power to form a plasma from the etch gas;
   (c) providing a pulsed bias voltage during the steady state etch gas flow, wherein the pulsed bias voltage has a frequency between 1 to 10,000 Hz; and
   (d) etching wider and narrower features at substantially the same etch rate into the conductive layer using the plasma formed from the etch gas.

14. The method of etching recited in claim 13 wherein the silicon containing component and oxygen containing component comprise siloxane.

15. The method of etching recited in claim 13 wherein the oxygen containing component comprise at least one of ozone and $H_2O$.

16. The method of etching recited in claim 13 wherein the silicon containing component comprises material in accordance with the general formula R—SiO where the R group comprises an alkyl group.

17. The method of etching recited in claim 13 wherein the silicon containing component further comprises and material having a boiling point of 150° C. and below.

18. The method of etching recited in claim 13 wherein the silicon containing component comprises a siloxane material.

19. The method of etching recited in claim 13 wherein the silicon containing component comprises a material similar to a siloxane material where the bridging oxygen is replaced with a nitrogen.

20. The method of etching recited in claim 13 wherein the silicon containing component comprises a material similar to a siloxane material comprising at least one of tetramethyldisilazane, hexamethyldisilazane, or N-methyl-N-silyl-Silanamine.

21. The method of etching recited in claim 13 wherein the silicon containing component comprises at least one of an organosilicon compound based on the structural unit $Si A_x Z_{(4-x)}$ (where A is selected from the group H, F, Cl, Br, and I, where Z is an alkyl group and where x is from 0-4).

* * * * *